United States Patent

Mori et al.

[11] Patent Number: 5,958,808
[45] Date of Patent: Sep. 28, 1999

[54] LOW-PERMITTIVITY GLASS FIBERS

[75] Inventors: Masahiro Mori, Fukushima; Shinichi Tamura, Fukushi; Syoichi Saito, Fukushima; Kenzo Watabe, Fukushima; Tatsuo Inada, Fukushima; Masahiro Yamamoto, Fukushima, all of Japan

[73] Assignees: Nitto Boseki Co., Ltd; Nitto Glass Fiber Mfg. Co., Ltd., both of Fukushima-Ken, Japan

[21] Appl. No.: 08/930,056

[22] PCT Filed: Jun. 4, 1996

[86] PCT No.: PCT/JP96/01504

§ 371 Date: Mar. 18, 1998

§ 102(e) Date: Mar. 18, 1998

[87] PCT Pub. No.: WO96/39363

PCT Pub. Date: Dec. 12, 1996

[30] Foreign Application Priority Data

Jun. 5, 1995 [JP] Japan ................................. 7-137688

[51] Int. Cl.$^6$ ............................. C03C 13/00; C03C 13/02

[52] U.S. Cl. .................................. 501/38; 501/35; 501/36

[58] Field of Search .................................. 501/35, 36, 37, 501/38

[56] References Cited

U.S. PATENT DOCUMENTS 4,824,806  4/1989  Yokoi et al. .

FOREIGN PATENT DOCUMENTS 62-226839  5/1987  Japan .
6-211543   8/1994  Japan .
6-219780   8/1994  Japan .

*Primary Examiner*—Michael Marcheschi
*Attorney, Agent, or Firm*—Nixon & Vanderhye

[57] ABSTRACT

The low-dielectric-constant glass fiber of the present invention contains by weight, as a glass composition, 50 to 60% of $SiO_2$, 10 to 20% of $Al_2O_3$, 20 to 30% of $B_2O_3$, 0 to 5% of CaO, 0 to 4% of MgO, 0 to 0.5% of $Li_2O+Na_2O+K_2O$ and 0.5 to 5% of $TiO_2$, and is preferably used as glass for printed wiring boards.

5 Claims, No Drawings

LOW-PERMITTIVITY GLASS FIBERS

FIELD OF INDUSTRIAL UTILIZATION

The present invention relates to a low-dielectric-constant glass fiber, particularly to a low-dielectric-constant glass fiber having a low dielectric tangent suitable for use for the reinforcement of a high-density printed wiring board which is required to have a low dielectric tangent.

TECHNICAL BACKGROUND

With the times of highly computerized society in recent years, communication devices and equipment for satellite broadcasting and mobile radio communication tend to be digitized, and signals are tend to be processed at a higher speed. As a reinforcing material for a printed wiring board used therefor, conventionally, a glass fiber is used, and E glass is known as a commercially produced glass fiber of this kind.

Generally, when alternating current is applied to glass, the glass absorbs energy of the alternating current and absorbs it as heat. The dielectric loss energy absorbed is in proportion to a dielectric constant and a dielectric tangent determined by the component and structure of glass, and is expressed by the following equation, $$W = k f v^2 \times \epsilon \tan \delta$$

wherein W is a dielectric loss energy, k is a constant, f is a frequency, $v^2$ is a potential gradient, $\epsilon$ is a dielectric constant, and $\tan \delta$ is a dielectric tangent.

The above equation shows that as the dielectric constant and the dielectric tangent increase and as the frequency increases, the dielectric loss increases.

As far as E glass is concerned, it has a dielectric constant of 6.7 and a dielectric tangent of $12 \times 10^{-4}$ at a frequency of 1 MHz at room temperature, and a printed wiring board for which E glass is applied is not sufficient for satisfying the demands of an increase in density and signal processing at a higher speed. It is therefore desired to develop glass having a lower dielectric constant and a lower dielectric tangent than E glass, and one kind of glass called D glass has been developed. One example of D glass has a composition of $SiO_2$ 73%, $Al_2O_3$ 1.0%, $B_2O_3$ 22%, CaO 0.6%, MgO 0.5%, $Li_2O$ 0.6%, $Na_2O$ 1.2% and $K_2O$ 1.1%, and for example, it has a dielectric constant of 4.2 and a dielectric tangent of $10 \times 10^{-4}$ at a frequency of 1 MHz at room temperature.

However, D glass has poor meltability and is liable to cause striae and foams, and its glass fibers frequently undergo breaking at a spinning step. D glass therefore has a defect in poor productivity and poor workability. Further, D glass has another problem in that it is liable to undergo peeling from a resin of a printed wiring board due to its poor water resistance, so that no high reliability is attained when it is used in printed wiring boards.

JP-A-7-10598 discloses a glass having a composition of $SiO_2$ 50.0–60.0%, $Al_2O_3$ 10.0–18%, $B_2O_3$ 11.0–25.0%, CaO 0–10.0%, MgO 0–10.0%, MgO+CaO 1.0–15.0%, ZnO 0–10.0%, SrO 0–10.0% and BaO 1–10.0%. Since, however, the above glass contains, as an essential component, BaO which increases the dielectric constant, it is difficult to attain a sufficiently low dielectric constant. For attaining a low dielectric constant, it is inevitably required to decrease the content of BaO. The problem is that the glass has a high viscosity in this case so that it is poor in spinning workability. Further, BaO also has another problem that it decreases the life of a glass melting furnace since it is highly corrosive to a material of the glass melting furnace.

DISCLOSURE OF THE INVENTION

The present invention has been made in view of the above situations, and the object of the present invention is to provide glass of which the dielectric constant and the dielectric tangent are low and which is excellent in productivity and workability and is also excellent in water resistance.

The present inventors have made studies in various ways to achieve the above object, and as a result, have found that a glass fiber having a low dielectric constant and a low dielectric tangent can be obtained by particularly adjusting the content of $SiO_2$ in the composition of a glass fiber to 60% by weight or less and adjusting the content of $TiO_2$ in the composition to 0.5 to 5% by weight to improve the meltability of glass and by adjusting the total amount of $Li_2O$, $Na_2O$ and $K_2O$ in the composition to 0.5% by weight or less. The present invention has been accordingly completed.

That is, the low-dielectric-constant glass fiber of the present invention characteristically contains by weight, as a composition, 50 to 60% of $SiO_2$, 10 to 20% of $Al_2O_3$, 20 to 30% of $B_2O_3$, 0 to 5% of CaO, 0 to 4% of MgO, 0 to 0.5% of $Li_2O+Na_2O+K_2O$ and 0.5 to 5% of $TiO_2$, and for example, at a frequency of 1 MHz at room temperature, it has a dielectric constant of 4.5 or less and a dielectric tangent of $10 \times 10^{-4}$ or less.

Preferably, the glass fiber of the present invention contains by weight, as a composition, 50 to 60% of $SiO_2$, 14 to 18% of $Al_2O_3$, 24 to 28% of $B_2O_3$, 0 to 2.5% of CaO, 0 to 2.5% of MgO, 0 to 0.15% of $Li_2O$, 0 to 0.15% of $Na_2O$, 0 to 0.15% of $K_2O$ and 1 to 4% of $TiO_2$.

In the present invention, the reason for the above limitation of the glass composition is as follows.

$SiO_2$ is a component for forming a glass structure(skelton) together with $Al_2O_3$ and $B_2O_3$. When the content of $SiO_2$ is less than 50%, the water resistance decreases, and the dielectric constant increases to excess. When the above content exceeds 60%, the viscosity is too high, and it is difficult in some cases to form the composition into a fiber when the fiber is spun from the composition. The content of $SiO_2$ is therefore limited to 50 to 60%, and it is preferably 50 to 56%.

When the content of $Al_2O_3$ is less than 10%, it is likely to form a phase separation, and the glass therefore shows poor water resistance. When the above content exceeds 20%, the liquidus temperature increases and the spinning property is poor. The content of $Al_2O_3$ is therefore limited to 10 to 20%, and it is preferably 14 to 18%.

$B_2O_3$ is used as a fluxing agent, and works as a component for decreasing the viscosity and easing the melting. When the content of $B_2O_3$ is less than 20%, the dielectric tangent is too high. When it exceeds 30%, the water resistance is poor to excess. The content of $B_2O_3$ is therefore limited to 20 to 30%, and it is preferably 24 to 28%.

Both CaO and MgO are components for improving the water resistance. When the content of CaO exceeds 5%, or when the content of MgO exceeds 4%, the dielectric constant and the dielectric tangent are too high. The contents of CaO and MgO are therefore limited to 0 to 5% and 0 to 4%, respectively. The content of CaO is preferably 0 to 2.5%, and the content of MgO is preferably 0 to 2.5%.

All of $Li_2O$, $Na_2O$ and $K_2O$ are used as fluxing agents. When the total content of these exceeds 0.5%, the dielectric tangent is too high, and the water resistance is poor. The total content of $Li_2O+Na_2O+K_2O$ is limited to 0 to 0.5%, and preferably, the content of $Li_2O$ is 0 to 0.15%, the content of $Na_2O$ is 0 to 0.15% and the content of $K_2O$ is 0 to 0.15%.

$TiO_2$ is effective for decreasing the viscosity and the dielectric tangent. When the content of $TiO_2$ is less than 0.5%, striae and non-melting are caused at a spinning time, and the melting property is degraded in some cases, or the dielectric tangent is high. On the other hand, when the above content exceeds 5%, a phase separation is liable to be formed, and the resultant glass fiber shows poor chemical durability. The content of $TiO_2$ is therefore limited to 0.5 to 5%, and it is preferably 1 to 4%.

In addition to the above components, the glass fiber of the present invention may contain other components such as $ZrO_2$, $As_2O_3$, $Sb_2O_3$, ZnO, SrO, $Fe_2O_3$, $Cr_2O_3$, $P_2O_5$, $F_2$, $Cl_2$, $SO_3$, etc., up to 3% so long as the glass properties are not impaired.

The present invention will be explained in detail with reference to Examples. Glass compositions shown in Table 1 are based on claim 1 of the present invention, and glass compositions shown in Table 2 are based on claim 2 directed to preferred embodiments of claim 1. A batch which was prepared so as to have a sample glass composition shown in Table 1 or 2 was placed in a platinum crucible and melted in an electric furnace under conditions of 1,500 to 1,550° C. and 8 hours with stirring. A molten glass was cast onto a carbon plate to form glass cullet. The glass cullet was poured into a glass fiber manufacturing furnace and then melted at 1,300 to 1,400° C., and a fiber was spun from the molten glass, to show that the dissipation of a large amount of boric acid, which is formed when D glass is spun, was not observed, and that the composition was spinnable without any diffculty.

On the other hand, the glass cullet was melted in the form of a plate and gradually cooled, and both surfaces of the resultant plate were optically polished to obtain a sample having a diameter of 45 mm and a thickness of 2 mm, and the sample was measured for a dielectric constant and a dielectric tangent at a frequency of 1 MHz at room temperature with a precision LCR meter (supplied by Hewlett Packard) as a measuring apparatus. Further, concerning water resistance, a glass elution amount was measured, that is, the glass fiber obtained by the spinning was immersed in boiling water for 70 minutes and then measured for a glass component weight loss. Concerning a heat expansion coefficient, the glass cullet was melted in the form of a plate and gradually cooled, the resultant plate was polished to a size of 14 mm×8 mm×5 mm, and the plate was measured for a heat expansion coefficient in the range of from room temperature to 500° C. with a thermomechanical tester (supplied by Sinku Riko K.K.). A heat expansion coefficient at 100° C. is shown. Tables 1 and 2 show the measurement results.

TABLE 1

| Composition (wt %) | CEx. D glass | Example 1 | 2 | 3 | 4 | 5 | 6 | 7 | 8 |
|---|---|---|---|---|---|---|---|---|---|
| $SiO_2$ | 73.0 | 54.7 | 52.7 | 52.8 | 51.7 | 54.7 | 53.7 | 52.7 | 50.8 |
| $Al_2O_3$ | 1.0 | 14.0 | 14.0 | 13.0 | 13.0 | 12.0 | 11.0 | 14.0 | 15.0 |
| $B_2O_3$ | 22.0 | 26.0 | 26.0 | 27.0 | 26.0 | 28.0 | 27.0 | 26.0 | 26.0 |
| CaO | 0.6 | 1.0 | 1.0 | 2.0 | 4.0 | 4.0 | 3.0 | 2.0 | 4.0 |
| MgO | 0.5 | 3.0 | 3.0 | 2.0 | 2.0 | 3.0 | 2.0 | 2.0 | 2.0 |
| $Li_2O$ | 0.6 | 0.15 | 0.15 | 0.00 | 0.15 | 0.10 | 0.10 | 0.15 | 0.10 |
| $Na_2O$ | 1.2 | 0.15 | 0.15 | 0.10 | 0.15 | 0.10 | 0.10 | 0.15 | 0.10 |
| $K_2O$ | 1.1 | 0.00 | 0.00 | 0.10 | 0.10 | 0.10 | 0.10 | 0.00 | 0.00 |
| $Li_2O + Na_2O + K_2O$ | 2.9 | 0.30 | 0.30 | 0.20 | 0.40 | 0.30 | 0.30 | 0.30 | 0.20 |
| $TiO_2$ | 0 | 1.0 | 3.0 | 3.0 | 3.0 | 1.0 | 3.0 | 3.0 | 2.0 |
| Dielectric constant | 4.20 | 4.20 | 4.31 | 4.22 | 4.40 | 4.34 | 4.23 | 4.36 | 4.38 |
| Dielectric tangent ×10$^4$ | 10.0 | 8.4 | 7.4 | 4.7 | 5.2 | 8.9 | 6.0 | 7.0 | 5.2 |
| Temperature (° C.) at which viscosity = 10$^3$ poise | 1,405 | 1359 | 1316 | 1329 | 1306 | 1341 | 1348 | 1325 | 1281 |
| Glass elution amount (%) | 1.62 | 0.48 | 0.50 | 0.58 | 0.50 | 0.30 | 0.80 | 0.48 | 0.40 |
| Heat expansion coefficient ×10$^7$(/° C.) | 32.0 | 32.4 | 33.7 | 33.2 | 32.3 | 34.7 | 34.2 | 32.2 | 33.6 |

CEx. = Comparative Example

TABLE 2

| Composition (wt %) | CEx. D glass | Example 9 | 10 | 11 | 12 | 13 | 14 |
|---|---|---|---|---|---|---|---|
| $SiO_2$ | 73.0 | 52.9 | 52.9 | 54.3 | 54.3 | 52.9 | 54.3 |
| $Al_2O_3$ | 1.0 | 15.0 | 15.0 | 15.1 | 15.1 | 15.1 | 15.1 |
| $B_2O_3$ | 22.0 | 25.2 | 25.2 | 25.9 | 25.9 | 25.2 | 25.9 |
| CaO | 0.6 | 1.7 | 2.5 | 1.0 | 2.5 | 1.0 | 2.5 |
| MgO | 0.5 | 1.7 | 1.0 | 2.5 | 1.0 | 2.5 | 1.0 |
| $Li_2O$ | 0.6 | 0.10 | 0.12 | 0.10 | 0.08 | 0.08 | 0.12 |
| $Na_2O$ | 1.2 | 0.10 | 0.10 | 0.10 | 0.10 | 0.10 | 0.10 |
| $K_2O$ | 1.1 | 0.10 | 0.08 | 0.10 | 0.02 | 0.12 | 0.08 |
| $Li_2O + Na_2O + K_2O$ | 2.9 | 0.30 | 0.30 | 0.30 | 0.30 | 0.30 | 0.30 |
| $TiO_2$ | 0 | 3.0 | 3.0 | 1.0 | 1.0 | 1.0 | 1.0 |
| Dielectric constant | 4.20 | 4.46 | 4.50 | 4.36 | 4.39 | 4.46 | 4.42 |
| Dielectric tangent ×10$^4$ | 10.0 | 6.1 | 5.9 | 6.1 | 5.5 | 6.0 | 5.8 |
| Temperature (° C.) at which Viscosity = | 1,405 | 1320 | 1324 | 1348 | 1355 | 1316 | 1356 |

TABLE 2-continued

| Composition | CEx. | Example | | | | | |
|---|---|---|---|---|---|---|---|
| (wt %) | D glass | 9 | 10 | 11 | 12 | 13 | 14 |
| $10^3$ poise Glass elution amount (%) | 1.62 | 0.16 | 0.34 | 0.23 | 0.42 | 0.06 | 0.48 |

CEx. = Comparative Example

[Results]

As shown in Tables 1 and 2, the glass fibers in Examples had a dielectric constant of less than 4.8 and a dielectric tangent of less than $10 \times 10^{-4}$. Specifically, the dielectric constant was 4.2 to 4.8, and the dielectric tangent was within $5 \times 10^{-4}$ to $9 \times 10^{-4}$, and the glass fibers in Examples had a low dielectric constant and a low dielectric tangent nearly equivalent to those of D glass.

Further, as shown in Tables 1 and 2, D glass showed a glass elution amount of 1.62%, while all the glass fibers in Examples showed a glass elution amount of less than 1% and were excellent in water resistance.

Further, those temperatures when the glass fibers in Examples showed the viscosity $\mu$ (poise) of $\log \mu = 3.0$ as an index for spinning were lower than that of D glass. Therefore, boric acid was not easily dissipated, and the glass fibers in Examples were excellent in productivity.

Further, as shown in Table 1, the glass fibers in Examples had a heat expansion coefficient of $30 \times 10^{-7}/°$ C. to $35 \times 10^{-7}/°$ C., which values were smaller than $55 \times 10^{-7}$ of E glass, and the glass fibers in Examples had low heat expansion properties nearly equivalent to $32 \times 10^{-7}$ of D glass.

In the present invention, it can be seen that a glass fiber having a dielectric tangent of $7 \times 10^{-4}$ or less can be obtained by adjusting the content of MgO to 2.6% by weight or less.

The glass fiber of the present invention has a low dielectric constant and a low dielectric tangent and is excellent as a glass fiber for a printed wiring board, particularly for the reinforcement of a printed wiring board for a high-density circuit. Further, it has excellent properties with regard to productivity, water resistance and low heat expansion coefficient, and a glass fiber having stable qualities can be therefore stably supplied particularly for the reinforcement of printed wiring boards for high-density circuits.

A variety of base materials containing the glass fiber of the present invention, such as a woven fabric, a non-woven fabric, a knitted product, a chopped strand, a roving, a glass powder and a mat, and composite materials formed of at least one of these and a plastic (such as a sheet molding compound, a bulk molding compound and a prepreg) can be also used as resin-reinforcing materials for peripheral members or devices of communication machines and equipment.

What is claimed is:

1. A low-dielectric-constant glass fiber containing by weight, as a glass composition, 50 to 60% of $SiO_2$, 10 to 20% of $Al_2O_3$, 20 to 30% of $B_2O_3$, 0 to 5% of CaO, 0 to 4% of MgO, 0 to 0.5% of $Li_2O+Na_2O+K_2O$ and 0.5 to 5% of $TiO_2$.

2. The low-dielectric-constant glass fiber of claim 1, wherein the glass fiber contains by weight, as a glass composition, 50 to 56% of $SiO_2$, 14 to 18% of $Al_2O_3$, 24 to 28% of $B_2O_3$, 0 to 2.5% of CaO, 0 to 2.5% of MgO, 0 to 0.15% of $Li_2O$, 0 to 0.15% of $Na_2O$, 0 to 0.15% of $K_2O$ and 1 to 4% of $TiO_2$.

3. The low-dielectric-constant glass fiber of claim 1, wherein the glass fiber further contains at least one selected from $ZrO_2$, $As_2O_3$, $Sb_2O_3$, ZnO, SrO, $Fe_2O_3$, $Cr_2O_3$, $P_2O_5$, $F_2$, $Cl_2$ or $SO_3$.

4. The low-dielectric-constant glass fiber of claim 1, wherein the glass fiber has a dielectric constant of 4.2 to 4.8 and a dielectric tangent of $5 \times 10^{-4}$ to $9 \times 10^{-4}$ at a frequency of 1 MHz at room temperature.

5. The low-dielectric-constant glass fiber of claim 1, wherein the glass fiber is for use as a glass fiber for a printed wiring board.

* * * * *